(12) United States Patent
Shieh et al.

(10) Patent No.: US 8,735,991 B2
(45) Date of Patent: May 27, 2014

(54) HIGH GATE DENSITY DEVICES AND METHODS

(75) Inventors: Ming-Feng Shieh, Yongkang (TW);
Chang-Yun Chang, Taipei (TW);
Hsin-Chih Chen, Tucheng (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 244 days.

(21) Appl. No.: 13/308,671

(22) Filed: Dec. 1, 2011

(65) Prior Publication Data

US 2013/0140639 A1 Jun. 6, 2013

(51) Int. Cl.
*H01L 21/70* (2006.01)

(52) U.S. Cl.
USPC .................................. 257/374; 257/E27.06

(58) Field of Classification Search
USPC ....................................................... 257/374
See application file for complete search history.

(56) References Cited

U.S. PATENT DOCUMENTS

| | | | | |
|---|---|---|---|---|
| 2012/0112288 A1* | 5/2012 | Luo et al. | | 257/368 |
| 2012/0146103 A1* | 6/2012 | Zhu et al. | | 257/255 |
| 2012/0187501 A1* | 7/2012 | Zhu et al. | | 257/369 |

\* cited by examiner

*Primary Examiner* — Lex Malsawma
(74) *Attorney, Agent, or Firm* — Haynes and Boone, LLP

(57) ABSTRACT

A semiconductor device with an isolation feature is disclosed. The semiconductor device includes a plurality of gate structures disposed on a semiconductor substrate, a plurality of gate sidewall spacers of a dielectric material formed on respective sidewalls of the plurality of gate structures, an interlayer dielectric (ILD) disposed on the semiconductor substrate and the gate structures, an isolation feature embedded in the semiconductor substrate and extended to the ILD and a sidewall spacer of the dielectric material disposed on sidewalls of extended portion of the isolation feature.

20 Claims, 6 Drawing Sheets

HIGH GATE DENSITY DEVICES AND METHODS

BACKGROUND

When a semiconductor device such as a metal-oxide-semiconductor field-effect transistor (MOSFET) is scaled down through various technology nodes, several strategies have been employed to improve device performance, such as using high-k (HK) dielectric material and metal gate (MG) electrode structures, strain engineering, 3-D gate transistors and ultra-thin body (UTB) semiconductor-on-insulator (SOI) structures. For example, by implementing a strained substrate technology, a better device performance is often achieved by modulating strain in a transistor channel, which enhances mobility (e.g., electron or hole mobility) and thereby conductivity through the channel. As an example of strain technology, an epitaxial silicon germanium (SiGe), or silicon phosphorus (SiP) layer, is formed in source and drain regions in p-type FET (PFET) devices, or n-type FET (NFET) devices, respectively.

As device scale decreases and device density increases, consistency of neighboring structures may be affected. Accordingly, although existing approaches have been generally adequate for their intended purpose, they have not been entirely satisfactory in all respects. For example, when a shallow trench isolation (STI) is formed prior to the formation of a nearby SiGe epitaxy structure, the resulting SiGe epitaxy structure may be quite different from another SiGe epitaxy structure further away from the STI.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

SUMMARY

Figure 1:
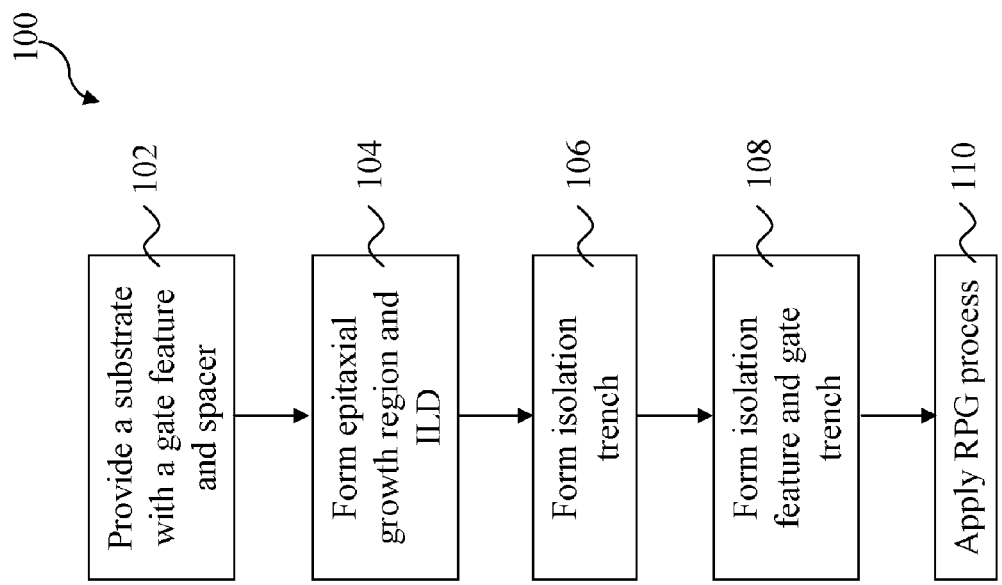
FIG. 1 is a flowchart of an example method for making a semiconductor device having an isolation feature according to various aspects of the present disclosure.

One of the broader forms of the present disclosure involves a semiconductor device with an isolation feature. An exemplary semiconductor device includes a plurality of gate structures disposed on a semiconductor substrate, a plurality of gate sidewall spacers of a dielectric material formed on respective sidewalls of the plurality of gate structures, an interlayer dielectric (ILD) disposed on the semiconductor substrate and the gate structures, an isolation feature embedded in the semiconductor substrate and extended to the ILD and a sidewall spacer of the dielectric material disposed on sidewalls of extended portion of the isolation feature.

In another embodiment, a semiconductor device includes a silicon substrate, two high-k/metal gate (HK/MG) features disposed on the substrate, a plurality gate spacers of dielectric material formed on respectively sidewalls of the HK/MG features, a plurality of epitaxial growth silicon germanium regions formed between the two HK/MG features, wherein the epitaxial growth regions have a uniform shape and uniform crystal facets to each other, an ILD disposed on the semiconductor substrate and HK/MG features, an isolation feature embedded in the semiconductor substrate and extended to the ILD and a sidewall spacer of dielectric material disposed on sidewalls of extended portion of the isolation features.

Another one of the broader forms of the present disclosure involves a process of forming a semiconductor device with an "isolation last" method. The process includes providing a semiconductor substrate, forming a plurality of dummy gate structures in the substrate, forming gate sidewall spacers on sidewalls of dummy gate structures, forming a plurality of epitaxial growth regions between the dummy gate structures, after forming the plurality of epitaxial growth regions, removing one of the dummy gate structures to form an isolation trench, filling in the isolation trench with a dielectric layer to form an isolation feature, removing the remaining dummy gate structures to form gate trenches and forming gate structures in the gate trenches.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

FIG. 1 is a flowchart of one example embodiment of a method 100 for making a semiconductor device having an isolation feature constructed according to various aspects of the present disclosure. The method 100 is described with reference to FIGS. 2 through 6. In a "gate last" (or replacement gate) scheme, a dummy (sacrificial) gate structure is initially formed and followed by a normal complementary metal oxide semiconductor (CMOS) process flow until deposition of an inter-layer dielectric (ILD). Some of the dummy gate structures may then be removed to form trench isolation features. The rest of the dummy gates are replaced with metal gate structures. Thus, the gate is formed after high temperature processes have been applied in formations, such as source and drain regions.

Figure 2:
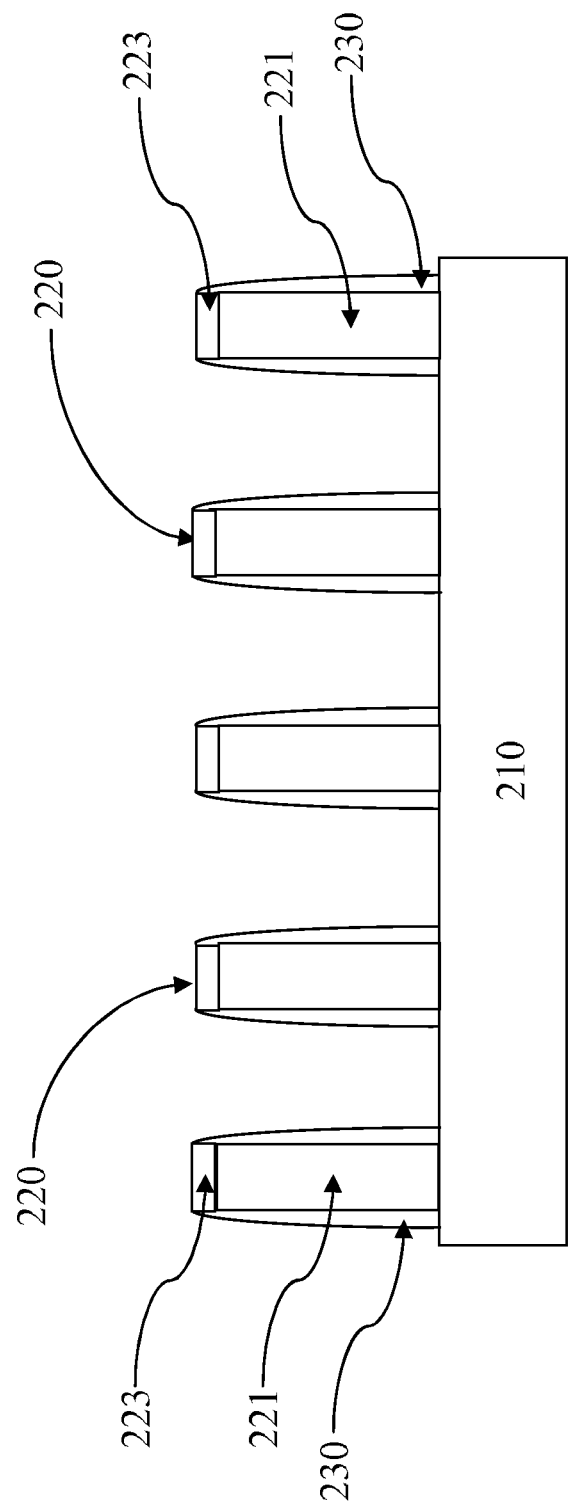
FIGS. 2 to 6 are cross-sectional views of an example embodiment of a semiconductor device having an isolation feature at fabrication stages constructed according to various aspects of the present disclosure.

Referring to FIGS. 1 and 2, the method 100 begins at step 102 by providing a semiconductor substrate 210. The semiconductor substrate 210 includes silicon. Alternatively or additionally, the substrate 210 may include other elementary semiconductor such as germanium, a compound semiconductor such as SiC, gallium arsenic, indium arsenide, or indium phosphide, or an alloy semiconductor such as SiGe, silicon germanium carbide, gallium arsenic phosphide, or gallium indium phosphide.

In one embodiment, the substrate 210 includes an epitaxial layer. The substrate may have an epitaxial layer overlying a bulk semiconductor. Further, the substrate 210 may be strained for performance enhancement. For example, the epitaxial layer may include a semiconductor material different from those of the bulk semiconductor such as a layer of SiGe overlying a bulk silicon or a layer of silicon overlying a bulk SiGe formed by a process including selective epitaxial growth (SEG). Furthermore, the substrate 210 may include a semiconductor-on-insulator (SOI) structure. In one embodiment, the substrate may include a buried oxide (BOX) layer formed by a process such as separation by implanted oxygen (SIMOX) or other suitable technique, such as wafer bonding and grinding. In fact various embodiments may include any of a variety of substrate structures and materials. In the depicted embodiment, the substrate 210 includes a silicon substrate.

Continuing with FIG. 2, the substrate 210 also includes a gate structure 220 formed by deposition, pattern and etch techniques. The gate structure 220 includes a dummy gate structure. A dummy gate structure refers to a gate structure which will be replaced with a metal gate in subsequent processes. In the depicted embodiment, the gate structure 220 includes a dummy gate structure. The dummy gate structure 220 includes a dummy gate layer 221, such as polysilicon, amorphous silicon or other appropriate materials. The dummy gate layer 221 is deposited over the substrate 210 by deposition techniques. For example, silane ($SiH_4$), di-silane ($Si_2H_6$), or di-chlorosilane ($SiCl_2H_4$) may be used as a chemical gas in a chemical vapor deposition (CVD) process to form a polysilicon layer. Alternatively and additionally, a dummy oxide layer (not shown), such as silicon dioxide ($SiO_2$) or silicon oxynitride (SiON), is disposed over the substrate 210 by thermal oxidation, chemical oxidation, CVD, atomic layer deposition (ALD) or any appropriate method. Thereafter, the dummy gate layer 221 is disposed over the dummy oxide layer.

An etch stop layer (ESL) 223 may be additionally formed on top of the dummy gate layer 221. In an embodiment, the ESL 223 includes a contact etch stop layer (CESL). The ESL 223 may include silicon nitride, silicon oxide, SiON, and/or other suitable materials. The ESL 223 may be formed by plasma-enhanced chemical vapor deposition (PECVD), physical vapor deposition (PVD), and/or other deposition processes known in the art. In the depicted embodiment the dummy gate layer 221 includes polysilicon and the ESL 223 includes silicon nitride. The ESL 223 and the dummy gate layer 221 are patterned and etched, in a conventional manner, to form the dummy gate structure 220, as shown in FIG. 2.

The substrate 210 may also include various doped regions such as p-wells and n-wells (not shown), formed by implantation techniques. As an example, a portion of the substrate 210 is doped p-type and formed a p-well where an n-channel device will be fabricated. Similarly, another portion of the substrate 210 is doped n-type and formed an n-well where a p-channel device will be fabricated. The doped regions are doped with p-type dopants, such as boron or difluoroborane ($BF_2$), and/or n-type dopants, such as phosphorus or arsenic. The doped regions may be formed directly on the substrate 210, in a p-well structure, in an n-well structure, in a dual-well structure, or using a raised structure.

The substrate 210 may further include source and drain (S/D) regions (not shown) formed by a proper technique, such as one or more ion implantations. The S/D regions may further include light doped source/drain (LDD) regions substantially aligned with the dummy gate structure 220 and heavily doped S/D regions (not shown) substantially aligned with associated gate sidewall spacers 230, which are described below.

Typically, after the formation of the S/D regions, one or more annealing processes are performed to activate the S/D regions. The annealing processes include rapid thermal annealing (RTA), laser annealing processes, or other suitable annealing processes. As an example, a high-temperature thermal annealing step may apply temperatures anywhere in the range of 900° C.-1100° C., though other embodiments may use temperatures within a different range. Alternatively, high-temperature annealing may include thermal processes with temperatures above 600° C. This embodiment may further include a "spike" annealing process that has a very short time duration.

Referring to FIG. 2, gate sidewall spacers 230 are formed on the sidewalls of the dummy gate structure 220. The gate sidewall spacers 230 generally include a dielectric material such as silicon oxide. Alternatively, the gate sidewall spacers 230 may include silicon nitride, SiC, SiON, or combinations thereof. Typical formation methods for the gate sidewall spacers 230 include depositing a dielectric material over the gate structure 220 and then anisotropically etching back the dielectric material. In the depicted embodiment the gate sidewall spacer 230 includes silicon nitride.

Figure 3:
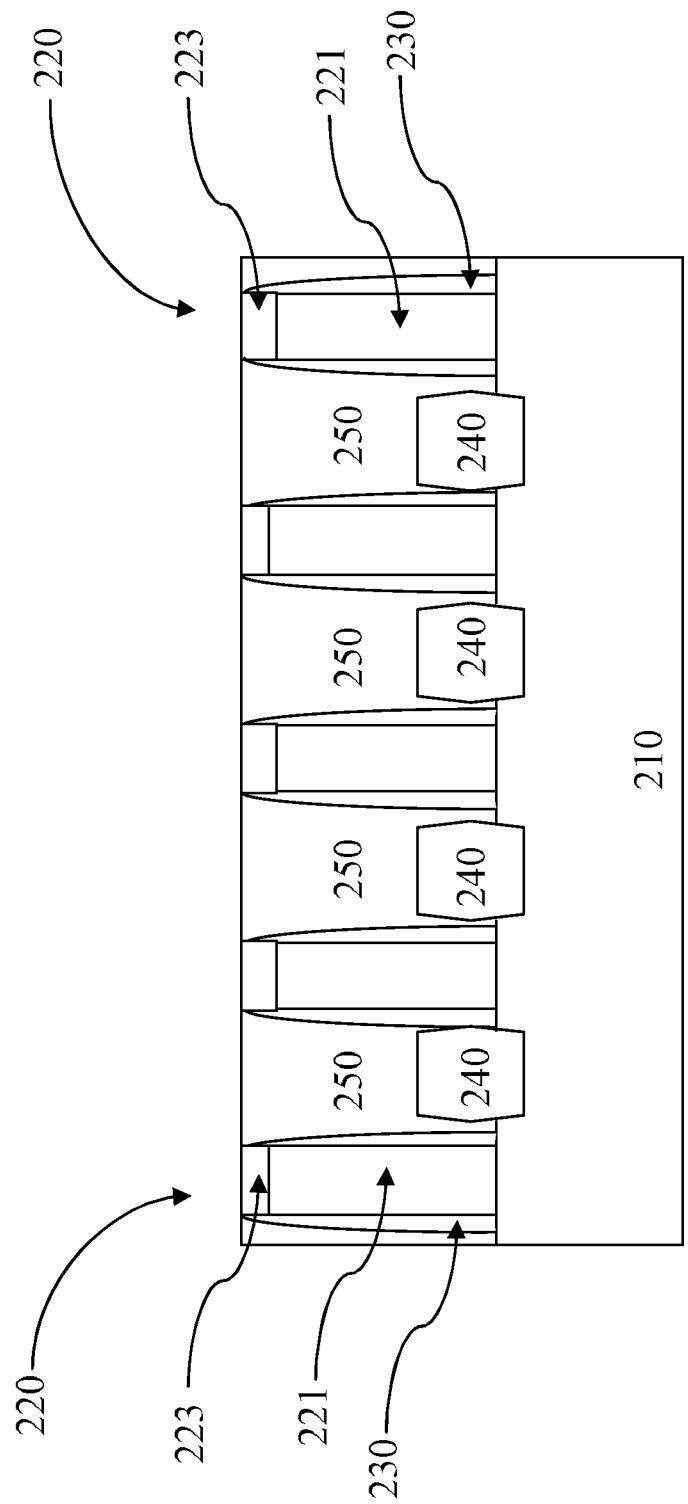

The method 100 proceeds to step 104, where an epitaxial growth process is performed to create an epitaxial growth region 240, as shown in FIG. 3. As an example, an etch process may be performed to recess the substrate 210 first, and then the epitaxial growth process is applied to grow the epitaxial growth region 240 in the recessed area. The epitaxial growth region 240 may include SiGe in a p-type metal oxide semiconductor (PMOS) transistor region of the substrate 210 (while an n-type metal oxide semiconductor (NMOS) transistor region may be protected by a patterned mask layer). In one embodiment, the epitaxial growth region 240 may include SiP in an NMOS transistor region (while a PMOS transistor region may be protected by a patterned mask layer). Alternatively, numerous other embodiments of epitaxial growth materials are suitable for processes, such as silicon, germanium, gallium arsenide, indium phosphide, silicon carbide, silicon phosphide, silicon carbide phosphide, and/or other suitable materials.

Additionally, the epitaxial growth region 240 may be formed such that it is raised above the surface of the substrate 210. In some embodiments, the epitaxial growth region 240 may be in-situ doped with p-type impurities, such as boron or indium, to form S/D regions of the PMOS device.

The epitaxial growth region 240 may provide proper stress effect to associated channels of PFET and NFET to enhance carrier mobility and improve device performance. In order to have a consistent strain effect on all associated channels, a uniform epitaxial growth region 240 in all related areas is desired.

Continuing with FIG. 3, an interlayer dielectric (ILD) layer 250 is formed on the substrate 210 and the dummy gate structure 220. The ILD layer 250 may be formed by CVD, high density plasma CVD, spin-on methods, sputtering, and/or other suitable methods. The ILD layer 250 typically includes silicon oxide, SiON, a low k material, tetraethylorthosilicate (TEOS) oxide, un-doped silicon glass, or doped silicon oxide such as borophosphosilicate glass (BPSG), fused silica glass (FSG), phosphosilicate glass (PSG), boron doped silicon glass (BSG), and/or other suitable materials. In the depicted embodiment, the ILD layer 250 includes silicon oxide. A chemical mechanical polishing (CMP) process may be performed subsequently to remove excess ILD layer 250 such that the ESL 223 of the dummy gate feature 220 is exposed. The CMP process may provide a substantially planar surface for the gate structure 220 and the ILD layer 250, as shown in FIG. 3.

Figure 4:
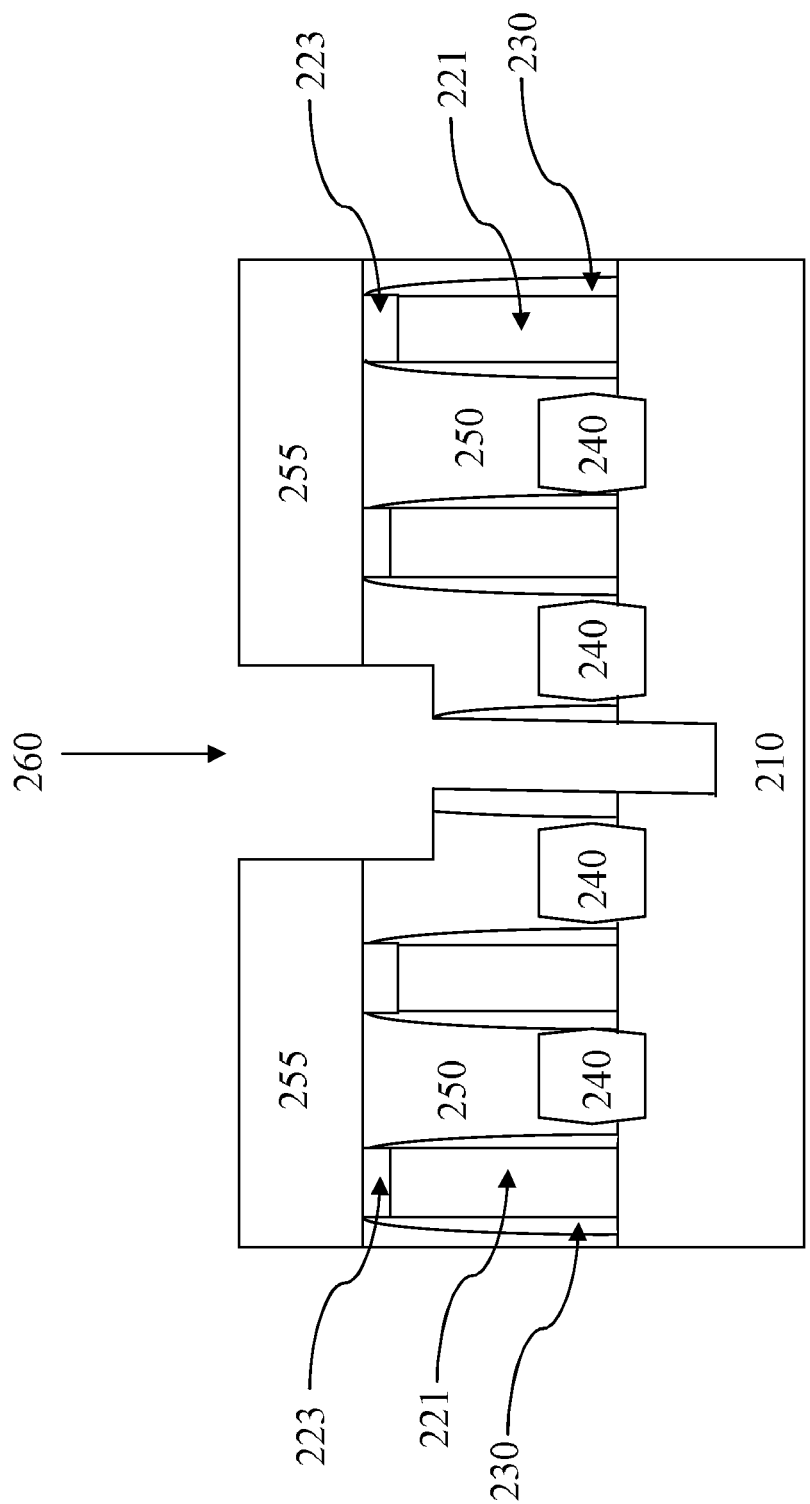

The method 100 proceeds to step 106 by forming an isolation trench 260 by pattern and etch techniques, as shown in FIG. 4. The isolation trench 260 is formed in a location where an electrically isolation is needed to separate each active area or each device. A lithography process forms a patterned photoresist layer 255 and the etching is thereafter implemented by using the patterned photoresist layer 255 as an etch mask. An exemplary lithography process may include processing steps of coating, soft baking, mask aligning, exposing pattern, post-exposure baking, developing photoresist, and hard baking of photoresist layer 225. The lithography process may also be implemented or replaced by other proper methods such as maskless photolithography, electron-beam writing, ion-beam writing, or molecular imprinting.

Referring to FIG. 4, an etch process is performed to form the isolation trench 260. The etch process may include several etch portions. A multi-portion etch process may provide multiple etch stages, and each etch stage may achieve its own etch selectivity and etch profile. Etch selectivity describes an etch rate ratio between different materials being etched. Etch selectivity may be chosen by choosing etching type and etching conditions.

The etch process may include a dry etch, a wet etch, or a combination of dry and wet etch. For example, a wet etch process may include exposure to a hydroxide containing solution (e.g., ammonium hydroxide), deionized water, and/or other suitable etchant solutions. In another example, a dry etch process may utilize a medium-density plasma etch system equipped with a capacitively coupled plasma source, or a high-density plasma etch system equipped with either inductive, helicon, or electron cyclotron resonance (ECR) plasmas, wherein the exposed material is anisotropically removed by plasma.

The mechanism of etching in each dry-etch process may have a physical basis (e.g. glow-discharge sputtering, or ion milling) or a chemical basis (e.g., in pure plasma etching) or a combination of the both (e.g., reactive ion etching or RIE). Sputtering relies on the directional nature of the incident energetic ions to etch in a highly anisotropic manner. Pure plasma etching, a chemical basis etching, may achieve a very high selectivity against both mask material and underlying layers and typically etch in an isotropic fashion. Combining both physical and chemical mechanism etching offers a controlled anisotropic etch with adequate selectivity.

For example, a first etch portion may remove the ESL 223 and dummy gate layer 221 of the exposed dummy gate structure 220. As another example, the first etch portion may be designed to remove a portion of the ILD 250 to create a wide opening for an upper portion of the isolation trench 260. A profile of an isolation trench with a wide opening on its upper portion may enhance conformability of a subsequent film filling process. In the depicted embodiment, the first etch portion includes a fluorine-containing plasma etch, such as CF4 and SF6, combining with O2 and He.

The etch process continues with a second etch portion to etch the substrate 210 through openings defined by the first etch portion. The second etch portion may have a different selectivity to minimize the ILD 250 loss during the etch. Meanwhile, with the gate sidewall spacers 230 slowing down lateral etching, the second etch portion is performed as a self-align etch process and the trench profile aligns along with the gate sidewall spacer 230.

The second etch portion may include a different dry etching process that utilizes a combination of $HBr/Cl_2/O_2/He$.

The dry etching removes portions of the substrate 210 that are unprotected or exposed in the isolation trench 260. Accordingly, the second etch portion may form a trench profile that may substantially align with the edge of the gate sidewall spacer 230 by a directional/anisotropic etching. The isolation trench 260 includes an upper portion and a lower portion. The upper portion of the isolation trench 260 is in the ILD layer 250 and the lower portion of the isolation trench 260 is in the semiconductor substrate 210. Thereafter, the photo resist layer 255 is removed by a process such as wet stripping or $O_2$ plasma ashing.

Figure 5:
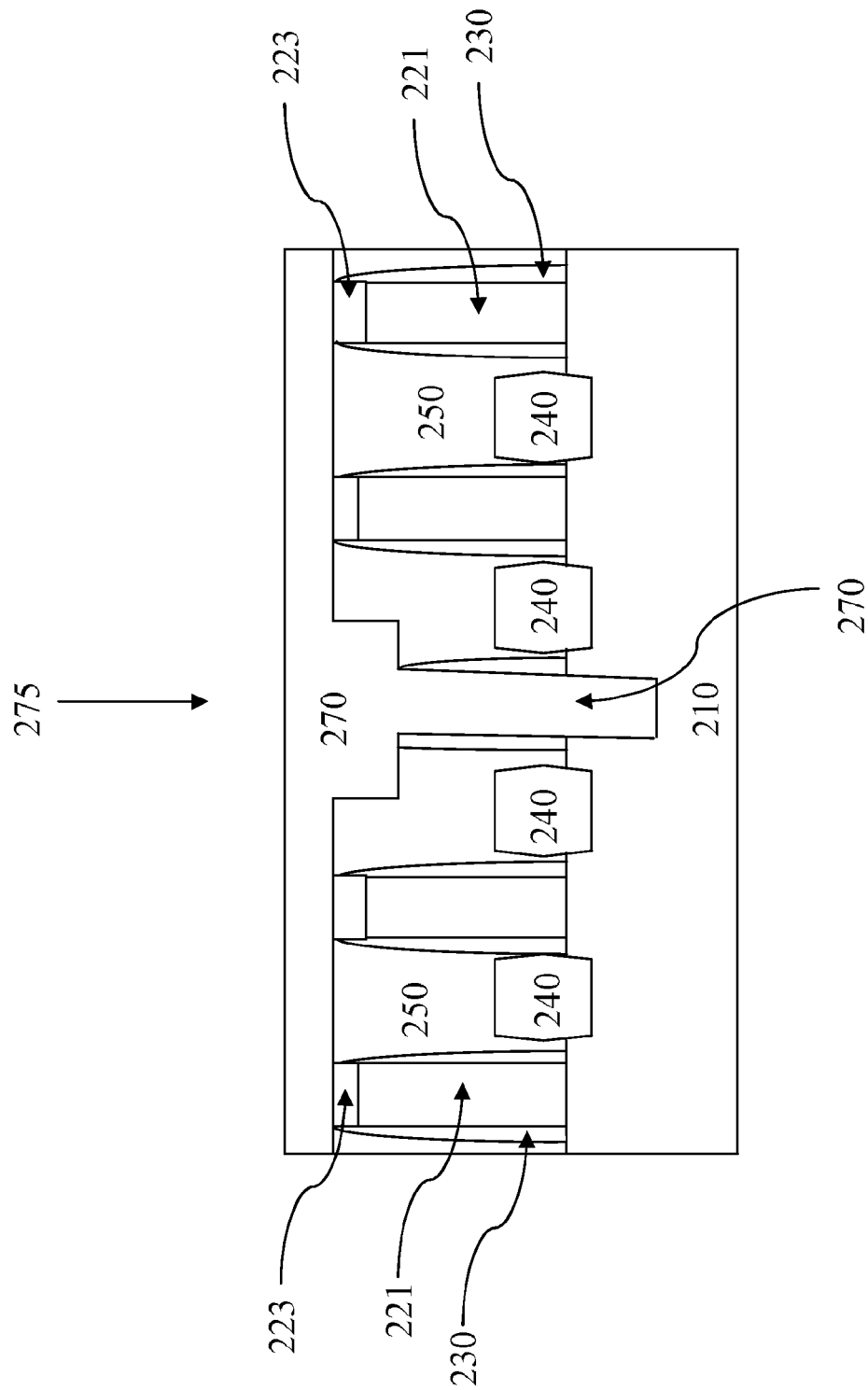
Figure 6:
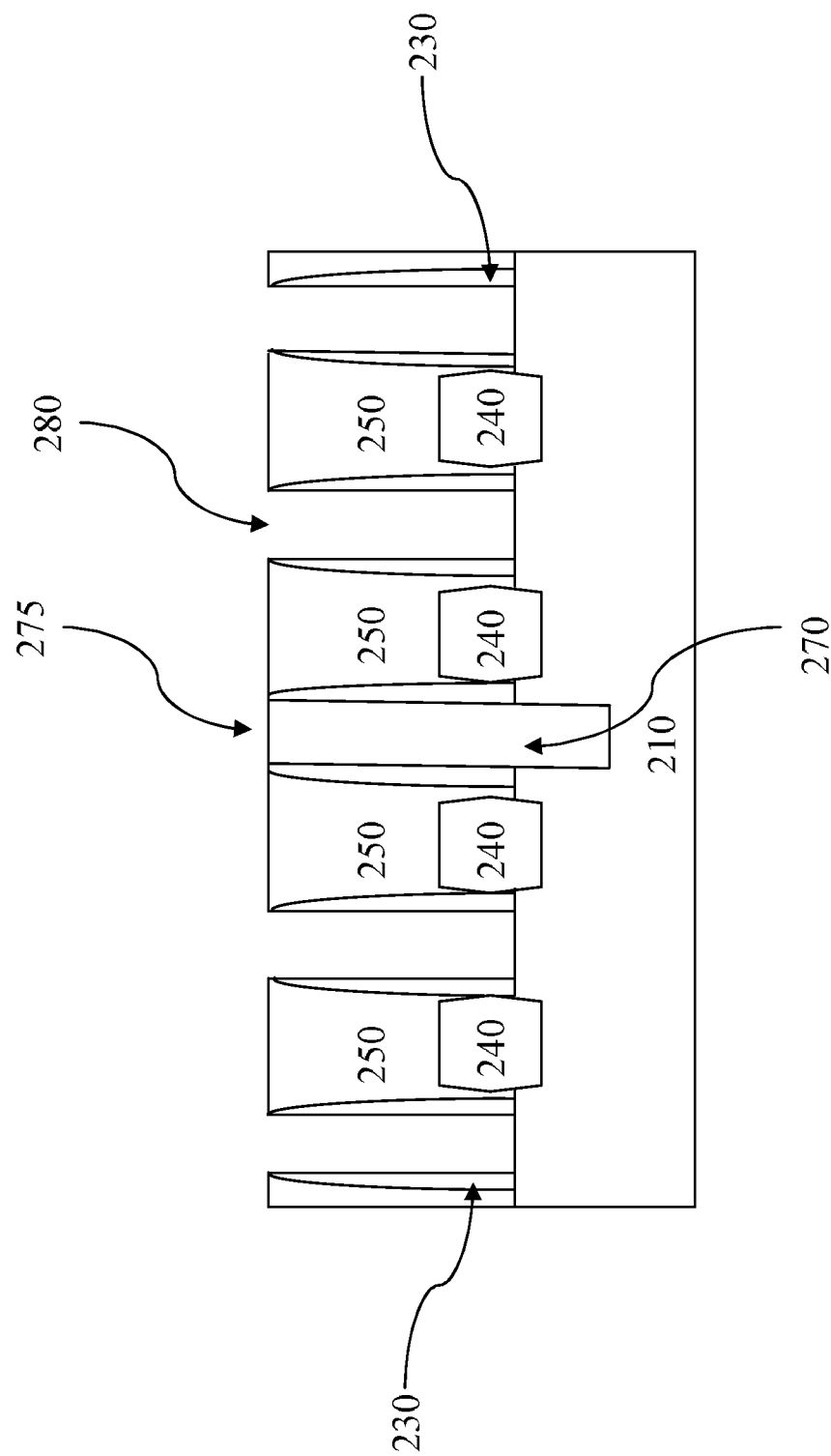

The method 100 proceeds to step 108 by forming an isolation feature 275, as shown in FIGS. 5 and 6. The isolation feature 275 is formed by filling in isolation trench 260 with dielectric materials such as silicon oxide, silicon nitride, or silicon oxynitride. The isolation feature 275 may have a multi-layer structure, such as a thermal oxide liner layer filled with silicon nitride or silicon oxide. In furtherance of the embodiment, the isolation feature 275 may include a trench liner by ALD and be filled with a dielectric film by a CVD, PVD, a thermal oxidation, or combinations thereof. In the depicted embodiment, the isolation feature 275 includes a silicon oxide liner (not shown) formed by an ALD technique and a silicon oxide layer 270 formed by a CVD technique, as shown in FIG. 5. The isolation feature 275 is embedded in the semiconductor substrate 210 and extended to the ILD 250. The isolation feature 275 includes the gate sidewall spacer 230 as its extended portion.

A CMP process is typically performed to remove excess silicon oxide layer 270 and a portion of the upper portion of the isolation feature 275. The CMP process may provide a substantially planar surface for the remaining portion of dummy gate structure 220, the ILD layer 250 and the isolation feature 275. An etching process may remove the remaining portion of dummy gate layer 221 to form a gate trench 280, as shown in FIG. 6. The remaining dummy gate layer 221 may be removed by dry etch, wet etch, or a combination of dry and wet etch in a conventional manner.

The method 100 proceeds to step 110 by forming a gate structure according to a replacement gate (RPG) process flow. A typical gate structure formation in RPG process flow includes forming an interfacial layer (IL), a HK dielectric layer, capping layers, work function metal layers, barrier layers and an electrode metal layer on the gate trench 280. A CMP process may be performed to remove excess metal layers. The CMP process may have a high selectivity of metal layers to dielectric layer 250. The CMP process provides a substantially planar surface for the metal gate stacks and the ILD layer 250.

The method 100 may further include forming a multilayer interconnection. The multilayer interconnection (not shown) may include vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form a tungsten plug in the contact holes.

Referring to FIG. 6, in the depicted embodiment, the method 100 forms the isolation feature 275 having a profile with a nature of self-aligning to the gate sidewall spacers 230. It may leave more margins for a device layout and a process control window for fabricating a high gate density device, such as a CMOS or Fin field-effect transistor (FinFET). The isolation feature 275 is formed after the formation of the epitaxial growth region 240. Thus, the method 100 may be referred to as an "isolation last" method. In this isolation last method, each of the epitaxial growth regions 240 may be formed under a fairly similar epitaxial growth surrounding in all associated locations. The epitaxial growth surrounding may include the dimension of epitaxial growth spacing, the type of materials used for epitaxial growth from and existing neighboring features (e.g. the gate sidewall spacer 230) which the epitaxial growth region 240 grows along with.

A consistent epitaxial growth surrounding enhances a uniform epitaxial growth region 240 in all associated locations, in term of size, shape, crystal facet and crystal orientation of the epitaxial growth region 240. A uniformly epitaxial growth region 240 in all associated locations may enhance an uniformly strained channel in all associated locations, which may enhance consistent channel performance such as carrier mobility in all associated locations. It may also provide an uniformly landing condition for forming future S/D contacts in all associated locations and thus it may improve contact resistance (to silicide) uniformity and reliability. Another embodiment of the present invention involves applying the isolation last method in a FinFET device to form an isolation feature. By applying the isolation last method, the end of the OD (active area) line may substantially self-align with the gate sidewall spacer 230 and may provide a uniform strain to associated channels. The epitaxial growth process may experience fairly similar source-drain (SA) width and result in a uniformly epitaxial growth regions in all associated locations. The margins of the device layout and processing window may also be optimized.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a plurality of gate structures disposed on a semiconductor substrate;
   a plurality of gate sidewall spacers of a dielectric material formed on respective sidewalls of the plurality of gate structures;
   an interlayer dielectric (ILD) disposed on a top surface the semiconductor substrate and the gate structures, wherein the ILD has a topmost surface facing away from the top surface of the substrate;
   an isolation feature embedded in the semiconductor substrate and extended to the ILD, wherein the isolation feature has a topmost surface facing away from the top surface of the substrate; and
   a sidewall spacer of the dielectric material disposed on sidewalls of extended portion of the isolation feature, and
   wherein the topmost surface of the ILD is substantially coplanar with the topmost surface of the isolation feature.

2. The semiconductor device of claim 1, further comprising epitaxial growth regions near the isolation feature and near the gate structures.

3. The semiconductor device of claim 2, wherein the epitaxial growth regions have a uniform shape to each other.

4. The semiconductor device of claim 2, wherein the epitaxial growth regions have uniform crystal facets to each other.

5. The semiconductor device of claim 1, wherein the epitaxial growth regions includes silicon germanium.

6. The semiconductor device of claim 1, wherein the isolation feature comprises a sidewall spacer on an upper portion of the isolation feature.

7. The semiconductor device of claim 6, wherein the profile of the isolation feature is aligned to edges of the sidewall spacer.

8. The semiconductor device of claim 1, wherein the sidewall spacer comprises silicon nitride.

9. The semiconductor device of claim 1, wherein the isolation feature comprises one or more dielectric materials.

10. The semiconductor device of claim 9, wherein the dielectric materials of the isolation feature includes a silicon oxide liner.

11. The semiconductor device of claim 10, wherein the dielectric materials of the isolation feature includes silicon oxide on top of the silicon oxide liner.

12. The semiconductor device of claim 1, further comprising a first sidewall spacer physically contacting a first sidewall of the isolation feature and a second sidewall spacer physically contacting a second sidewall of the isolation feature, wherein the first sidewall of the isolation feature opposes the second sidewall of the isolation feature.

13. The semiconductor device of claim 1, wherein the first and second sidewall spacers physically contact the top surface of the semiconductor substrate.

14. The semiconductor device of claim 1, wherein the first sidewall spacer has a topmost surface facing away from the semiconductor substrate, and
   wherein the topmost surface of the first sidewall spacer is substantially coplanar with the topmost surface of the ILD.

15. The semiconductor device of claim 1, wherein the topmost surface of the isolation structure is free of the ILD.

16. A semiconductor device, comprising:
   a silicon substrate;
   two high-k/metal gate (HK/MG) features disposed on the substrate;
   a plurality gate spacers of dielectric material formed on respectively sidewalls of the HK/MG features;
   a plurality of epitaxial growth silicon germanium regions formed between the two HK/MG features, wherein the epitaxial growth regions have a uniform shape and uniform crystal facets to each other; and
   an ILD disposed on a top surface of the semiconductor substrate and HK/MG features, wherein the ILD has a topmost surface facing away from the top surface of the substrate;
   an isolation feature embedded in the semiconductor substrate and extended to the ILD such that a topmost surface of the isolation feature facing away from the top surface of the substrate is substantially coplanar with topmost surface of the ILD; and
   a sidewall spacer of dielectric material disposed on sidewalls of extended portion of the isolation features.

17. The semiconductor device of claim 16, further comprising a first sidewall spacer physically contacting a first sidewall of the isolation feature and a second sidewall spacer physically contacting a second sidewall of the isolation feature, wherein the first sidewall of the isolation feature opposes the second sidewall of the isolation feature.

18. The semiconductor device of claim 17, wherein the first sidewall spacer physically contacts the top surface of the semiconductor substrate.

19. The semiconductor device of claim 17, wherein the first sidewall spacer has a topmost surface facing away from the semiconductor substrate, and
   wherein the topmost surface of the first sidewall spacer is substantially coplanar with the topmost surface of the ILD.

20. The semiconductor device of claim 17, wherein the isolation feature is positioned between the two HK/MG features disposed on the substrate.

\* \* \* \* \*